(12) United States Patent
Baker et al.

(10) Patent No.: US 7,030,977 B2
(45) Date of Patent: Apr. 18, 2006

(54) NON-CONTACT OPTICAL SYSTEM FOR PRODUCTION TESTING OF ELECTRONIC ASSEMBLIES

(75) Inventors: Jay D. Baker, West Bloomfield, MI (US); Charles F. Schweitzer, South Lyon, MI (US); Zhong-You (Joe) Shi, Ann Arbor, MI (US); William Zhang, Troy, MI (US)

(73) Assignee: Visteon Global Technologies, Inc., Van Buren Township, MI (US)

( * ) Notice: Subject to any disclaimer, the term of this patent is extended or adjusted under 35 U.S.C. 154(b) by 335 days.

(21) Appl. No.: 10/430,669

(22) Filed: May 6, 2003

(65) Prior Publication Data

US 2004/0225400 A1 Nov. 11, 2004

(51) Int. Cl.
*G01N 21/00* (2006.01)
(52) U.S. Cl. .................. 356/237.1; 250/223 R
(58) Field of Classification Search ............ 356/237.1, 356/237.2; 438/16; 250/223 R
See application file for complete search history.

(56) References Cited

U.S. PATENT DOCUMENTS

| | | | |
|---|---|---|---|
| 3,956,698 A | 5/1976 | Malmberg et al. | |
| 4,843,329 A | 6/1989 | Beha et al. | |
| 5,030,909 A | 7/1991 | Blancha et al. | |
| 5,394,098 A | 2/1995 | Meyrueix et al. | |
| 6,058,497 A * | 5/2000 | Tuttle ..................... | 714/733 |
| 6,119,255 A | 9/2000 | Akram | |
| 6,161,205 A * | 12/2000 | Tuttle ..................... | 714/724 |
| 6,189,120 B1 * | 2/2001 | Akram ..................... | 714/724 |
| 6,285,200 B1 | 9/2001 | Pace et al. | |
| 6,448,802 B1 | 9/2002 | Hirt | |
| 6,487,681 B1 | 11/2002 | Tuttle et al. | |
| 6,567,162 B1 * | 5/2003 | Koren et al. ............. | 356/237.2 |
| 6,825,682 B1 * | 11/2004 | Kantz et al. ............. | 324/763 |
| 2002/0044266 A1 * | 4/2002 | Charles et al. ........... | 355/53 |
| 2002/0113958 A1 | 8/2002 | Wilsher et al. | |
| 2003/0047350 A1 * | 3/2003 | Forbes ..................... | 324/537 |

FOREIGN PATENT DOCUMENTS

WO WO 2003/067271 8/2003

* cited by examiner

*Primary Examiner*—Michael P. Stafira
*Assistant Examiner*—Juan D. Valentin, II
(74) *Attorney, Agent, or Firm*—Brinks Hofer Gilson & Lione

(57) ABSTRACT

The present invention provides a system for the contactless testing and configuring of electronic assemblies during the manufacturing process. The system includes an onboard optical transceiver, a system controller, and a controller optical transceiver. The onboard optical transceiver is located on the electronic assembly. The onboard optical transceiver is connected to an integrated circuit which is capable of performing functional tests or storing programs on the assembly. The controller optical transceiver is connected to the system controller and located adjacent to the electronic assembly. The onboard transceiver and the controller optical transceiver are used to establish a contactless communication link between the system controller and the electronic assembly. The contactless nature of the communication link allows the assembly to be transported past the controller optical transceiver by a simple conveyor while the system controller is communicating with the electronic assembly.

26 Claims, 3 Drawing Sheets

NON-CONTACT OPTICAL SYSTEM FOR PRODUCTION TESTING OF ELECTRONIC ASSEMBLIES

TECHNICAL FIELD

The present invention relates to a manufacturing system for producing and testing an electronic assembly without contacting the electronic assembly.

BACKGROUND

There has always been a need to test electronic assemblies during the manufacturing process. Currently, when it is necessary to perform a function test or to load a program into an assembly, the electronic assembly must be physically connected to the test equipment. Conventionally, this connection is achieved by interfacing a connector with the assembly or through the use of a test fixture having contacting test points that contact the assembly. Either prior art method involves the use of very expensive product specific tooling to interface the electronic assembly to the test equipment. Tooling which contacts the electronic assembly also requires the product to remain stationary requiring an extra stop station in the manufacturing process. Additionally, there is a significant risk of damaging the electronic assembly any time manufacturing equipment has to physically connect to the electronic assembly. The risk of damage increases over time as the tooling wears and eventually needs to be reworked.

In view of the above, it is apparent that there exists a need for a system for producing and testing electronic assemblies without contacting the electronic assembly.

SUMMARY

In satisfying the above need, as well as overcoming the enumerated drawbacks and other limitations of the related art, the present invention provides a system for the contactless testing and configuring of electronic assemblies during the manufacturing process. The system includes an onboard optical transceiver, a system controller, and a controller optical transceiver. The onboard optical transceiver is located on the electronic assembly. The onboard optical transceiver is connected to an integrated circuit which is capable of performing functional tests or storing programs on the assembly. Since optical transceivers are currently built into many electronic assemblies, there is often little or no added costs to the electronic assembly.

The controller optical transceiver is connected to the system controller and located adjacent to the electronic assembly. The onboard transceiver and the controller optical transceiver are used to establish a contactless communication link between the system controller and the electronic assembly. The system controller can use this communication link to download programs, initiate test sequences, and retrieve test results on the electronic assembly. The ability to perform these functions in a contactless fashion, eliminates the need for an expensive test fixture, and reduces the risk of damage caused by physically interfacing with the electronic assembly. The system controller can also be connected to a larger manufacturing network which downloads new software for the electronic assemblies, configures options for the specific assemblies, and tracks test data for the assemblies.

The present invention also provides for a conveyor. The contactless nature of the communication link allows the assembly to move pass the controller optical transceiver while the system controller is communicating with the electronic assembly. The ability to communicate while the electronic assembly is in motion is beneficial because the assembly can be transported using a low cost conveyor.

Further objects, features and advantages of this invention will become readily apparent to persons skilled in the art after a review of the following description, with reference to the drawings and claims that are appended to and form a part of this specification.

DETAILED DESCRIPTION

Figure 1:
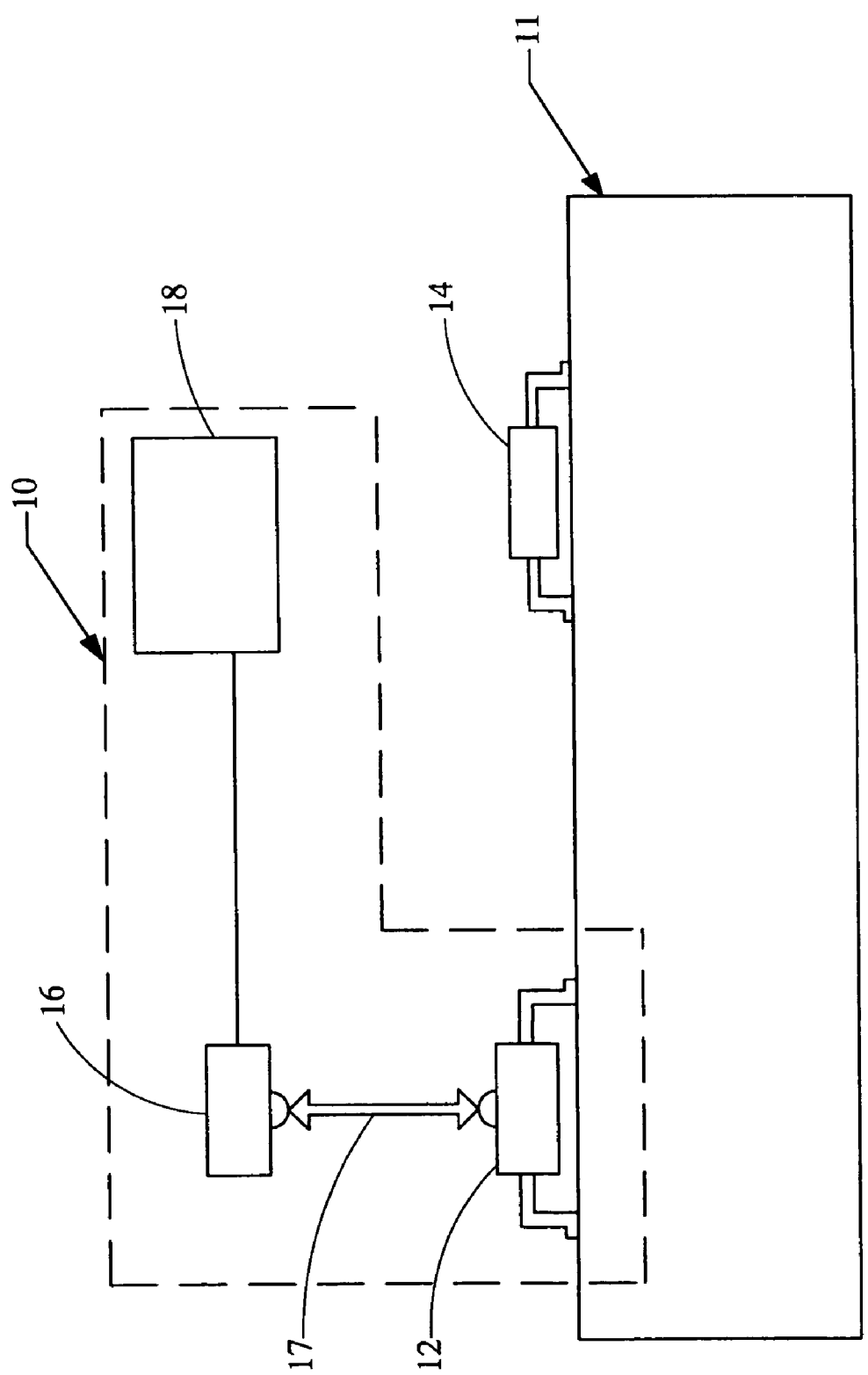
FIG. 1 is a schematic illustration of a manufacturing system for the contactless producing and testing of an electronic assembly.

Referring now to the drawings, a manufacturing system embodying the principles of the present invention is illustrated therein and designated at 10. Manufacturing system 10 includes an onboard optical transceiver 12, a system controller 18, and a controller optical transceiver 16.

Referring to FIG. 1, the onboard optical transceiver 12 is mounted to an electronic assembly 11. The onboard optical transceiver 12 is electrically coupled to an integrated circuit 14. The integrated circuit 14 being capable of performing functional tasks on the electronic assembly 11. The functional tasks include, but are not limited to, storing software, initiate test sequences, reporting test results. The onboard optical transceiver 12 is adapted to take electrical signals from the integrated circuit 14 and convert them to optical signals 17 to be transmitted through the air to the controller optical transceiver 16. The controller optical transceiver 16 is electrically coupled to the system controller 18.

Optical transceivers 12, 16 for communicating signals 17 through the air or through optical links are readily available. These transmitters typically use an infrared wave length of light. One such in infrared transceiver is available from Agilent Technologies No. HSDL-1100. However, the same task can be accomplished using a transmitter and a receiver pair. Further, the electronic assembly may contain multiple transceivers used for communication within the assembly.

Figure 2:
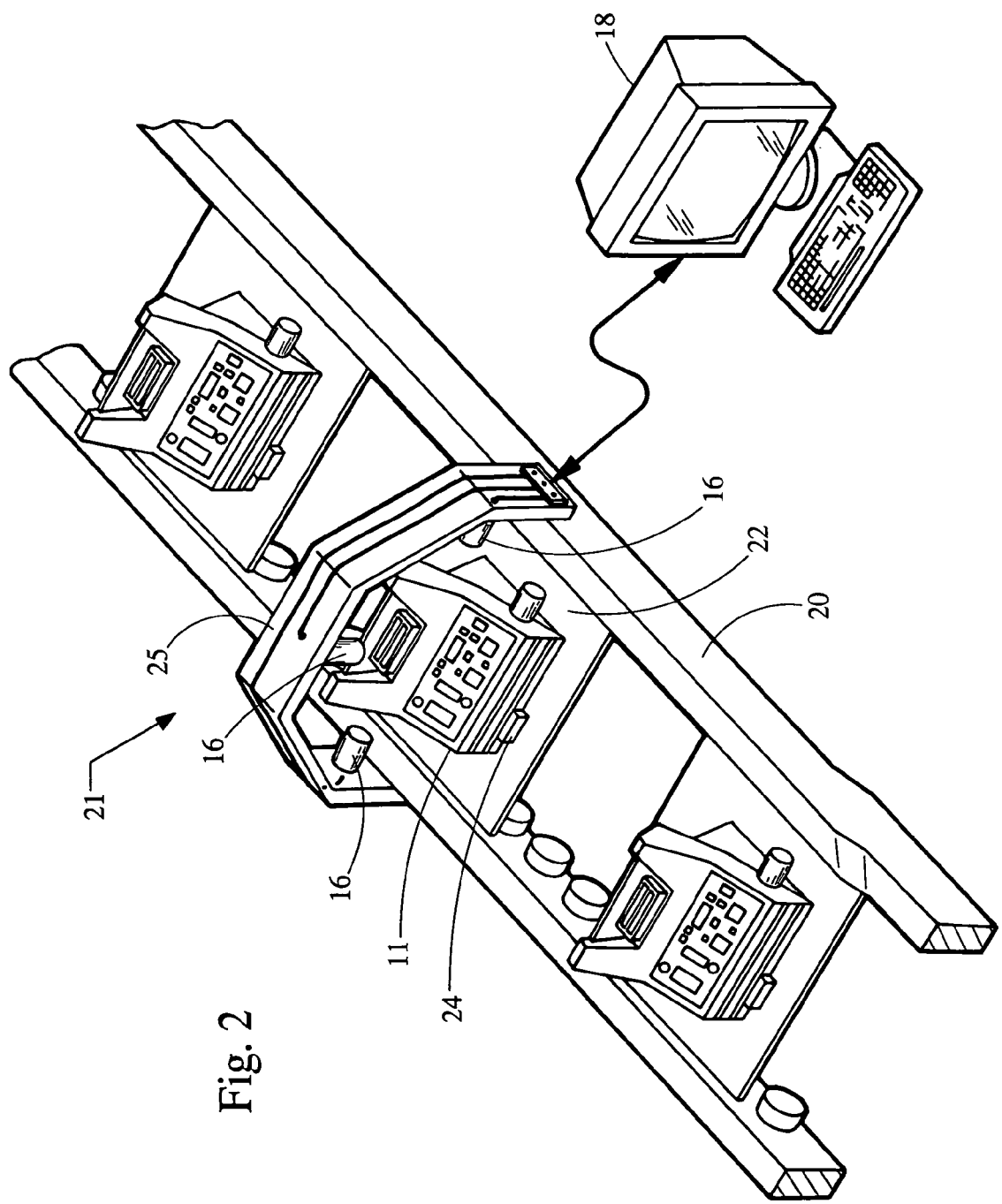
FIG. 2 is a diagrammatic view of the manufacturing system, illustrating the manufacturing system integrated into an assembly line.

Referring now to FIG. 2, manufacturing system 10 and conveyor 20 may be integrated into an assembly line 21. The controller optical transceivers 16 are shown mounted on a support structure 25 located over the conveyor 20. The controller optical transceivers 16 are positioned above and on each side of the electronic assembly 11 to provide communication with many models of the electronic assembly with various locations of the onboard optical transceiver 12. A Fixture 22 is configured for translation along conveyer 20. Fixture 22 orients the electronic assembly 11 relative to controller optical transceivers 16. A power supply 24 is attached to the Fixture 11, the fixture having contact points to provide power to the electronic assembly 11. The power supply 24 is for example a battery.

Figure 3:
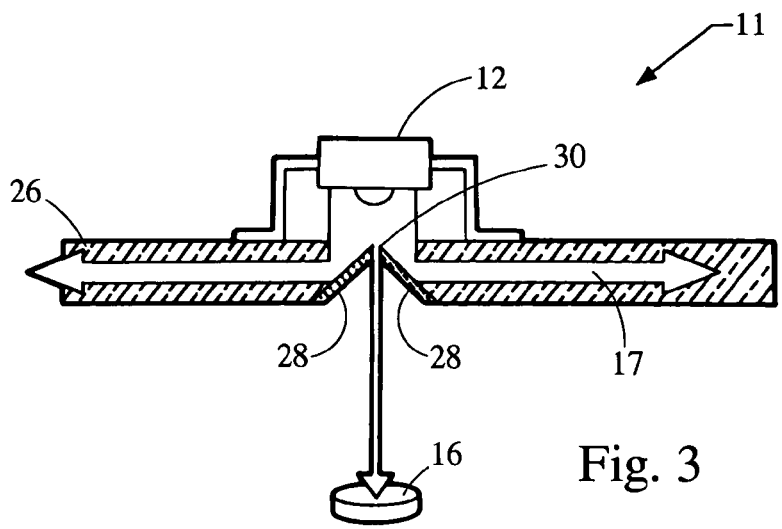
FIG. 3 is a cut away side view of the system illustrating an embodiment of the system where the onboard optical transceiver communicates with the controller optical transceiver through a light communication channel.

Now referring to FIG. 3, in an embodiment of the present invention a light communication channel 26 is provided in the electronic assembly 11. Light communication channel technology is now being implemented in many electronic assemblies. Light communication channel 26 is used for optical communication between components or even assemblies. The availability of the light communication channel 26 allows the manufacturing system to use existing components to provide communication for testing purposes.

The light communication channel 26 (LCC), is a structure made of at least one type of light-transmissive material formed into any shape that would allow transmission of a signal 17 in the form of light from one point to another. The LCC 26 can be used as a substrate such as an optical substrate that can be formed into various shapes such as a rectangular slab or the shape of a part or the entirety of, for example, a main frame of an instrument panel display. As such, it can be used as a primary or secondary transmission means for a signal, such as optical signal 17 propagating from at least one signal source to at least one signal receiver, or it may encompass various electronic and/or optical components to allow a signal such as optical signal 17 to be directed to various electronic and/or optical components within the substrate, without having to resort to the use of conventional signal focusing means such as a beam splitter or focusing lens. LCC 26 may also assume other shapes such as a ring, strand, sheet, or ribbon.

Structures that comprise LCC 26 may include an LCC in the form of strands or other structural shapes. Structures that comprise LCC 26 may also include an LCC connected or fabricated with one or more components or systems such as a detector, light source, or an electronic system.

Preferably, the LCC 26 comprises a polymeric material. The material comprising LCC 26 may be polybutylene terephthalate, polyethylene terephthalate, polypropylene, polyethylene, polyisobutylene, polyacrylonitrile, poly(vinyl chloride), poly(methyl methacrylate), silica, or polycarbonate. Preferably, the polymeric material is a photorefractive polymer.

Preferably, LCC 26 is made of at least one material that allows the transmission of light of various frequencies. Thus, for example, LCC 26 may comprise a first material transparent or translucent to a first frequency of the signals and a second material that is transparent or translucent to a second frequency of the signals.

LCC 26 may be fabricated using a moldable material so that LCC 26 can be cast and then cured to a desired shape. LCC 26 may have sections or areas that are connected, molded, or pressed onto a surface of a circuit board. In one aspect, LCC 26 may be integrated with structures such as printed circuit boards, flexible substrates, flatwire, and MID circuits.

The LCC 26 preferably has a reflective coating on at least one of its surfaces. In one aspect of the invention, the reflective coating covers the entire surface or substantially the entire surface of the except for the portions of the surface where the signal source and signal receivers are operatively connected to the LCC 26. The reflective coating may be used to, for example, cover only the surface of LCC 26 that substantially encompass a volume of LCC 26 through which the signal source is transmitted to the signal receivers. The entire LCC may be coated with a reflective material.

The reflective coating can be made of any material that reflects the signal 17 transmitted through LCC 26. The reflective coating can also be made of at least one metal or metallic alloy containing metals such as aluminum, copper, silver, or gold.

Still referring to FIG. 3, the onboard optical transceiver 12 is mounted on the surface of the electronic assembly 11 and is optically coupled to the light communication channel 26. One or more surface signal routers 28 are oriented so that the optical signal 17 from the onboard optical transceiver 12 is redirected to propagate along the light communication channel 26.

Surface signal router 28 can be a reflective coating on the surface of the LCC. The surface signal router 28 directs signal 17 from the signal source to one or more target signal recipients, such as a photodetector or an IR analyzer, that are positioned at various points on the surface of the LCC 26. Surface signal routers 28 in the form of reflective coatings can be strategically distributed throughout the various areas or sections of the surface of LCC 26 depending on factors such as the number and type of components that form part of a signal conduction network. They can also assume the form of inclined, oblique, or wedge-shaped cuts on the surface of the 3-D LCC 26. As used herein, an "inclined" cut includes cuts having an angular shape relative to a surface of LCC 26; this includes oblique and wedge-shaped cuts. Routers 28 in the form of surface cuts with other shapes such as zig-zag, wavy, or combinations of various shapes may also be used. Preferably, these surface cuts are coated with at least one reflective material such as a metal or metal alloy.

Again referring to FIG. 3, surface signal routers 28 have an opening 30 which allows the optical signals 17 from the onboard transceiver 12 to escape the light communication channel 26 and travel through the air, where the optical signals 17 are received by the controller optical transceiver 16.

Optical signals 17 propagating through the light communication channel may be channeled or transmitted through air if there are no obstacles in their path. The transmitters 12, 16 preferably generate a light signal 17 with a unique wavelength. A wavelength selective filter (not shown) may be placed in front of signal receiver 12, 16 so that little or no interference occurs between different transmitters and signal receivers.

Power sources (not shown) that produce energies corresponding to different wavelengths may be used to power different signal receivers 12, 16 that have photoreceptors sensitive to certain wavelengths. Further narrowing of the wavelength range may be performed using at least one optic element (not shown) such as bandpass filter.

An optical signal 17 may be directed in any direction within the LCC 26, unless, for example, the signal source or another component blocks the signal. The signal 17 may propagate, sequentially or simultaneously, along the same or opposite directions. The signal receivers 12, 16 may be positioned in any suitable location on a surface of the LCC 26 where the signal receivers 12, 16 can receive optical signal 17 from at least one signal source 12, 16. Multiple signal receivers may receive signals from a single signal source.

Figure 4:
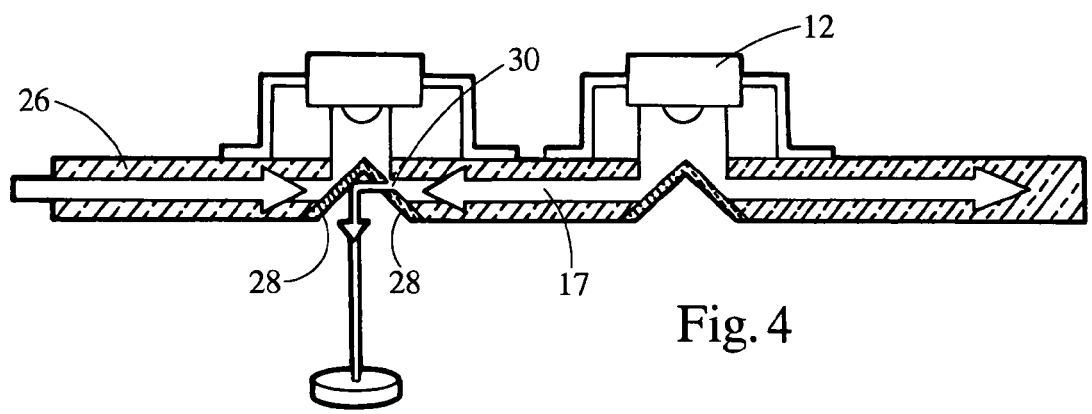
FIG. 4 is a cut away side view of the manufacturing system, where the onboard optical transceiver communicates to the controller optical transceiver using a light communication channel and a surface signal router.

Referring now to FIG. 4, another embodiment of the manufacturing system 10 provides that the onboard optical transceiver 12 propagates the optical signals 17 along the light communication channel 26. The surface signal router 28 is located in the light communication channel 26 so as to redirect the optical signal 17 from the transceiver 12 to propagate in a direction perpendicular to the light communication channel 26. An opening 30 in the surface signal router 28 allows the signal 17 from the transceiver 12 to escape the light communication channel 26 and travel through the air to be received by the controller optical transceiver 16.

Figure 5:
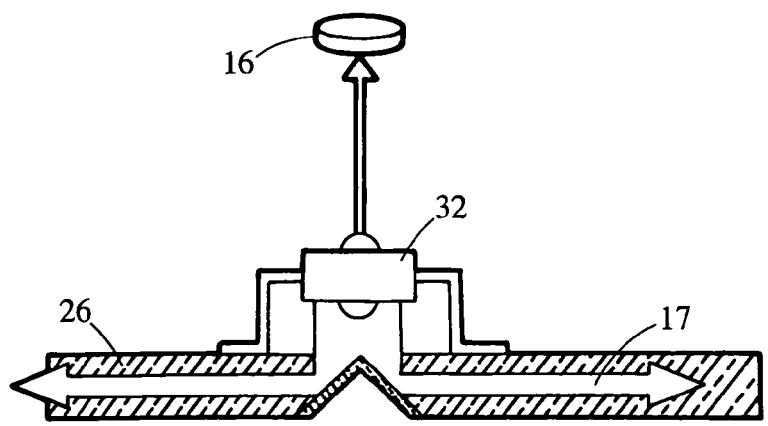
FIG. 5 is a side cut away view of the manufacturing system, where the onboard optical transceiver communicates with both the light communication channel and directly with the controller optical transceiver.

Referring now to FIG. 5, yet another embodiment of the manufacturing system 10 provides a bidirectional transceiver 32. The bidirectional transceiver 32 is adapted to receive and transmit signals 17 to the light communication channel 26 while simultaneously transmitting and receiving signals 17 through the air to the controller optical transceiver 16.

Referring to the operation in a manufacturing environment of the embodiments described above, the system controller 18 transmits electrical signals to the controller optical transceiver 16. The controller optical transceiver 16 converts the electrical signals into optical signals 17 that are transmitted through the air and received by the onboard optical transceiver 12. The onboard optical transmitter 12 converts optical signals 17 back to electrical signals that are communicated to the integrated circuit 14 to initiate the test sequence. At the end of the test sequence, the integrated circuit 14 communicates the results by transmitting electrical signals back to the onboard optical transceiver 12. The onboard optical transceiver 12 converts the electrical signals to optical signals 17 and transmits the optical signals 17 to the controller optical transceiver 16. The controller optical transceiver 16 converts the optical signals 17 to the electrical signals and communicates the electrical signals to the system controller 18. The system controller 18 stores the results of the test for that particular assembly. The optical signals 17 communicating between the controller optical transceiver 16 and the onboard optical transceiver 12 creates a contactless communication link between the system controller 18 and the electronic assembly 11. The contactless link allows the electronic assembly 11 to communicate as it is moved past the controller optical transceiver 16 without stopping or being contacted by the test equipment. Therefore, the assembly 11 can be transported past the controller optical transceiver 16 simply by using conveyor 20.

As a person skilled in the art will readily appreciate, the above description is meant as an illustration of implementation of the principles of this invention. This description is not intended to limit the scope or application of this invention in that the invention is susceptible to modification, variation and change, without departing from spirit of this invention, as defined in the following claims.

We claim:

1. A manufacturing system for producing an electronic assembly, the electronic assembly including an integrated circuit adapted to perform functional tasks on the electronic assembly, the manufacturing system comprising:
   an on-board optical transceiver mounted on the electronic assembly and operatively coupled to the integrated circuit;
   a controller optical transceiver adapted to communicate contactlessly with the on-board optical transceiver;
   a system controller electrically coupled with the controller optical transceiver to contactlessly communicate data with the electronic assembly, for performing the functional tasks on the electronic assembly; and
   a conveyor adapted to transport the electronic assembly past the controller optical transceiver during transmission of the data.

2. The manufacturing system according to claim 1, further comprising a fixture transported by the conveyor, for supporting the electronic assembly.

3. The manufacturing system according to claim 2, wherein the fixture is adapted to power the electronic assembly.

4. The manufacturing system according to claim 3, further comprising a power source connected to the fixture to supply power to the electronic assembly.

5. The manufacturing system according to claim 4, wherein the power source is a battery.

6. The manufacturing system according to claim 1, further comprising a on-board light communication channel which is coupled to the on-board optical transceiver, the on-board light communication channel being adapted to propagate the data in communication with the on-board optical transceiver.

7. The manufacturing system according to claim 6, wherein the on-board optical transceiver is a bi-directional transceiver, the bi-directional transceiver being adapted to transmit and receive optical signals with the controller optical transceiver while simultaneously communicating with the on-board light communication channel.

8. The manufacturing system according to claim 6, wherein the on-board light communication channel has an opening which allows the data to travel outside the on-board light communication channel.

9. The manufacturing system according to claim 8, the system further comprising a surface signal router located in the on-board light communication channel, for redirecting the data traveling through the on-board light communication channel.

10. The manufacturing system according to claim 9, wherein the opening is located in the surface signal router.

11. The manufacturing system according to claim 10, wherein the surface signal router redirects the data to communicate with the on-board optical transceiver.

12. The manufacturing system according to claim 11, wherein the surface signal router redirects the data to communicate with a device other than the on-board optical transceiver.

13. The manufacturing system according to claim 9, wherein the surface signal router redirects the data toward the controller optical transceiver.

14. The manufacturing system according to claim 9, wherein the surface signal router redirects the data from the controller optical transceiver along the direction of the on-board light communication channel.

15. The manufacturing system according to claim 1, wherein the data corresponds to a program to be stored on the electronic assembly.

16. The manufacturing system according to claim 1, wherein the data initiates a test sequence on the electronic assembly.

17. The manufacturing system according to claim 1, wherein the data corresponds to a set of configuration parameters for the electronic assembly.

18. A contactless method of manufacturing an electronic assembly, the electronic assembly including an integrated circuit adapted to perform functional tasks on the electronic assembly, the contactless method comprising the steps of:
   generating-data for performing the functional tasks on the electronic assembly;
   transmitting the data from a system controller;
   receiving data contactlessly on the electronic assembly; and
   conveying the electronic assembly during the steps of transmitting and receiving the data.

19. The contactless method according to claim 18, wherein the data corresponds to a program to be stored on the electronic assembly.

20. The contactless method according to claim 18, wherein the data initiates a test sequence on the electronic assembly.

21. The contactless method according to claim 18, wherein the data corresponds to a set of configuration parameters for the electronic assembly.

22. A contactless method of manufacturing an electronic assembly, the electronic assembly including an integrated circuit adapted to perform functional tasks on the electronic assembly, the contactless method comprising the steps of:

generating data for performing the functional tasks on the electronic assembly;

communicating the data from a system controller to a controller optical transceiver;

converting the data to an optical signal using the controller optical transceiver;

receiving the optical signal contactlessly using an on-board optical transceiver;

converting the optical signal to the data on the electronic assembly; and conveying the electronic assembly during the step of receiving the data.

23. The contactless method according to claim 22, wherein the data corresponds to a program to be stored on the electronic assembly.

24. The contactless method according to claim 22, wherein the data initiates a test sequence on the electronic assembly.

25. The contactless method according to claim 22, wherein the data corresponds to a set of configuration parameters for the electronic assembly.

26. The contactless method according to claim 22, comprising the step of directing the optical signal through a light communication channel.

* * * * *

UNITED STATES PATENT AND TRADEMARK OFFICE
CERTIFICATE OF CORRECTION

| | | |
|---|---|---|
| PATENT NO. | : 7,030,977 B2 | Page 1 of 1 |
| APPLICATION NO. | : 10/430669 | |
| DATED | : April 18, 2006 | |
| INVENTOR(S) | : Jay D. Baker et al. | |

It is certified that error appears in the above-identified patent and that said Letters Patent is hereby corrected as shown below:

Column 6, in claim 18, line 5, delete "generating-data" and substitute --generating data-- in its place.

Signed and Sealed this

Seventh Day of November, 2006

JON W. DUDAS
*Director of the United States Patent and Trademark Office*